US008658880B2

(12) United States Patent
Dutta et al.

(10) Patent No.: US 8,658,880 B2
(45) Date of Patent: *Feb. 25, 2014

(54) METHODS OF DRAWING WIRE ARRAYS

(75) Inventors: Biprodas Dutta, Silver Spring, MD (US); Ian L. Pegg, Alexandria, VA (US); Sezhian Annamalai, Silver Spring, MD (US); Rudra P. Bhatta, Fairfax, VA (US); Jugdersuren Battogtokh, Arlington, VA (US)

(73) Assignee: ZT3 Technologies, Inc., Thousand Oaks, CA (US)

( * ) Notice: Subject to any disclaimer, the term of this patent is extended or adjusted under 35 U.S.C. 154(b) by 911 days.

This patent is subject to a terminal disclaimer.

(21) Appl. No.: 12/457,517

(22) Filed: Jun. 12, 2009

(65) Prior Publication Data
US 2010/0083996 A1    Apr. 8, 2010

Related U.S. Application Data

(63) Continuation-in-part of application No. 11/301,285, filed on Dec. 9, 2005.

(60) Provisional application No. 61/061,310, filed on Jun. 13, 2008.

(51) Int. Cl.
H01L 35/34 (2006.01)
(52) U.S. Cl.
USPC ............ 136/201; 136/238; 136/239; 136/240
(58) Field of Classification Search
USPC ............ 136/200–242; 65/442, 444, 475, 477
See application file for complete search history.

(56) References Cited

U.S. PATENT DOCUMENTS 3,040,113 A    6/1962    Lindenblad
3,064,063 A    11/1962   Imelmann
(Continued)

FOREIGN PATENT DOCUMENTS

DE    2454620 B1    2/1976
JP    61-232242 A    10/1986
(Continued)

OTHER PUBLICATIONS

Abramson et al., "Fabrication and Characterization of a Nanowire/Polymer-Based Nanocomposite for a Prototype Thermoelectric Device," Journal of Microelectromechanical Systems, IEEE Service Center, vol. 13, No. 3, Jun. 1, 2004, pp. 505-513.

(Continued)

*Primary Examiner* — Thanh-Truc Trinh
(74) *Attorney, Agent, or Firm* — The Marbury Law Group PLLC

(57) ABSTRACT

A method of drawing a glass clad wire is provided herein, the method comprising: (i) sealing off one end of a glass tube such that the tube has an open end and a closed end; (ii) introducing a wire material inside the glass tube; (iii) heating a portion of the glass tube such that the glass partially melts to form a first ampoule containing the wire material to be used in a drawing operation; (iv) introducing the first ampoule containing the wire material into a heating device; (v) increasing the temperature within the heating device such that the glass tube is heated enough for it to be drawn and wire material melts; and (vi) drawing the glass clad wire comprising a continuous wire of wire material, wherein the wire material is a metal, semi-metal, alloy, or semiconductor thermoelectrically active material, and wherein the wire diameter is equal to or smaller than about 5 μm.

9 Claims, 13 Drawing Sheets

(56) References Cited

U.S. PATENT DOCUMENTS

| | | |
|---|---|---|
| 3,256,584 A | 6/1966 | Parkhachev |
| 3,262,251 A | 7/1966 | Hicks |
| 3,294,504 A | 12/1966 | Hicks |
| 3,356,539 A | 12/1967 | Stachurski |
| 3,452,423 A * | 7/1969 | Bates et al. ............... 228/205 |
| 4,453,961 A | 6/1984 | Berkey |
| 4,578,097 A | 3/1986 | Berkey |
| 4,652,288 A | 3/1987 | Saito |
| 4,659,355 A * | 4/1987 | Maze et al. ............... 65/388 |
| 4,839,487 A | 6/1989 | Ito et al. |
| 4,853,020 A | 8/1989 | Sink |
| 4,963,195 A | 10/1990 | Kodato et al. |
| 5,006,671 A | 4/1991 | Boeke |
| 5,110,334 A | 5/1992 | Ayers |
| 5,215,565 A | 6/1993 | Urano et al. |
| 5,240,066 A * | 8/1993 | Gorynin et al. ............ 164/461 |
| 5,491,452 A | 2/1996 | Ohtsubo et al. |
| 5,550,387 A | 8/1996 | Elsner et al. |
| 5,644,185 A | 7/1997 | Miller |
| 5,808,233 A | 9/1998 | Finkel et al. |
| 5,811,376 A | 9/1998 | Huang |
| 5,886,292 A | 3/1999 | Nishimoto |
| 5,900,071 A | 5/1999 | Harman |
| 6,060,656 A | 5/2000 | Dresselhaus et al. |
| 6,100,463 A | 8/2000 | Ladd et al. |
| 6,112,395 A | 9/2000 | Quick et al. |
| 6,174,352 B1 | 1/2001 | Semerdjian et al. |
| 6,231,744 B1 | 5/2001 | Ying et al. |
| 6,300,150 B1 | 10/2001 | Venkatasubramanian |
| 6,452,206 B1 | 9/2002 | Harman et al. |
| 6,514,453 B2 | 2/2003 | Vigliotti et al. |
| 6,584,808 B1 | 7/2003 | Roba et al. |
| 6,598,405 B2 | 7/2003 | Bell |
| 6,627,809 B1 | 9/2003 | Koga et al. |
| 6,670,539 B2 | 12/2003 | Heremans et al. |
| 6,696,635 B2 | 2/2004 | Prasher |
| 6,710,238 B1 | 3/2004 | Shingu et al. |
| 6,772,611 B2 | 8/2004 | Kliner et al. |
| 6,787,691 B2 | 9/2004 | Fleurial et al. |
| 6,828,579 B2 | 12/2004 | Ghamaty et al. |
| 6,858,154 B2 | 2/2005 | Suzuki et al. |
| 6,873,638 B2 | 3/2005 | Haase et al. |
| 6,882,051 B2 | 4/2005 | Majumdar et al. |
| 6,882,786 B1 | 4/2005 | Kliner et al. |
| 6,898,357 B2 | 5/2005 | Han et al. |
| 6,969,679 B2 | 11/2005 | Okamura et al. |
| 6,996,147 B2 | 2/2006 | Majumdar et al. |
| 7,115,971 B2 | 10/2006 | Stumbo et al. |
| 7,172,661 B1 | 2/2007 | Adar et al. |
| 7,254,151 B2 | 8/2007 | Lieber et al. |
| 2002/0176815 A1 | 11/2002 | Fleurial et al. |
| 2003/0047204 A1 | 3/2003 | Fleurial et al. |
| 2003/0079770 A1 | 5/2003 | Bell |
| 2003/0110892 A1 | 6/2003 | Nicoloau |
| 2003/0121540 A1 | 7/2003 | Onoue |
| 2003/0135971 A1 | 7/2003 | Liberman et al. |
| 2004/0107988 A1 | 6/2004 | Harman et al. |
| 2004/0112418 A1 | 6/2004 | Yang et al. |
| 2004/0238022 A1 | 12/2004 | Hiller et al. |
| 2004/0261829 A1 | 12/2004 | Bell |
| 2005/0051208 A1 | 3/2005 | Mount |
| 2005/0060884 A1 | 3/2005 | Okamura et al. |
| 2005/0105047 A1 | 5/2005 | Smith, III et al. |
| 2005/0150539 A1 | 7/2005 | Ghoshal et al. |
| 2005/0161662 A1 | 7/2005 | Majumdar et al. |
| 2005/0252248 A1 | 11/2005 | Kornreich et al. |
| 2006/0032526 A1 | 2/2006 | Fukutani et al. |
| 2006/0048809 A1 | 3/2006 | Onvural |
| 2006/0068080 A1 | 3/2006 | Yadav et al. |
| 2006/0118158 A1 | 6/2006 | Zhang et al. |
| 2006/0130995 A1 | 6/2006 | Adar et al. |
| 2006/0266402 A1 | 11/2006 | Zhang et al. |
| 2007/0131266 A1 | 6/2007 | Dutta |
| 2007/0131269 A1 | 6/2007 | Dutta |
| 2007/0245774 A1 | 10/2007 | Dutta |
| 2008/0169016 A1 | 7/2008 | Dutta |

FOREIGN PATENT DOCUMENTS

| | | |
|---|---|---|
| JP | 2004-193200 | 7/2004 |
| JP | 2005-197612 A | 7/2005 |
| JP | 2007-184566 A | 7/2007 |
| JP | 2007184566 A | 7/2007 |
| SU | 383094 | 8/1973 |
| WO | WO 98/00371 A1 | 1/1998 |
| WO | WO 00/30185 A1 | 5/2000 |

OTHER PUBLICATIONS

Supplementary European Search Report, Application No. EP 06844870, European Patent Office, Aug. 25, 2011, 3pgs.

Office Action issued in Chinese Patent Application No. 200880110858.6, dated May 9, 2011.

Office Action issued in Canadian Application No. 2,631,366, issued on Jan. 7, 2013.

Office Action issued in Chinese Application No. 200880110858.6, on Sep. 4, 2012.

Badinter et al., "Cast nanowires and nanowire-based filamentary nanostructures," 2003 IEEE Conference on Electron Devices and Solid-State Circuits, Dec. 16-18, 2003, p. 35-38.

Campo et al., "Frequency-dependent electrical mixing law behavior in spherical particle composites," Journal of Electroceramics, 2002, 9:49-56.

Cho et al., "Fabrication and heat treatment effects on absorption characteristics of glass fibers doped with PbTe semiconductor quantum dots," Optical Fiber Communication Conference and Exhibit, 2001, OFC 2001, vol. 4, p. ThC4-1 to ThC4-3.

Donald, I.W., "Production, properties and applications of microwire and related products," Journal of Materials Science, 1987, 22:2661-2679.

Ghamaty et al., "Quantum Well Thermoelectric Devices and Applications," $22^{nd}$ International Conference on Thermoelectrics, 2003, IEEE, 563-566.

Grunlan et al., "Lowering the Percolation Threshold of Conductive Composites Using Particulate Polymer Microstructure," Journal of Applied Polymer Science, 2001, 80(4):692-705.

Hicks et al., "The Effect of Quantum Well Structures on the Thermoelectric Figure of Merit," Materials Research Socitety Symposium Proceedings, 1993, 281:821-826.

Jacob et al., "Tellurite Glass Optical fiber doped with PbTe Quantum Dots," Proceeding of SPIE, vol. 5734, Apr. 2005, 124-129.

Kantser et al., "Electric Field Effect on Thermopower in Cylindrical Microwires," IEEE $22^{nd}$ International Conference on Thermoelectrics, 2003, 350-354.

Karg et al., "Novel Rapid-Thermal-Processing for CIS Thin-Film Solar Cells," Photovoltaic Specialists Conference, 1993, Conference Record of the $23^{rd}$ IEEE, May 1993, pp. 441-446.

Kempa et al., "Dielectric media based on isolated metallic nanostructures," J. Appl. Physics, 2005, 98:034310, 4 pages.

Leporda et al., "Long Glass-Coated Semimetallic and Semiconducting Wires Prepared by Two Different Liquid Phase Methods," Moldavian Journal of the Physical Sciences, 2002, 1(3):74-81.

Logvinov et al., "Upper Value of Thermoelectric Figure of Merit for Isotropic Semiconductors," $22^{nd}$ International Conference on Thermoelectrics, 2003, IEEE, La Grande-Motte, France, 452-455.

Meglei et al., "Glass-coated melt spinning fabrication technology and some physical properties of $Bi_2Te_3$ microwires," Moldavian Journal of the Physical Sciences, 2003, 2(2):277-289.

Petrovic et al., "Synthesis of silicon microwire," J. Mater. Res., Oct. 2001, 16(10):2777-2779.

Rogacheva et al., "Effect of Electron Concentration on the Thickness Dependences of the Thermoelectric Properties of PbTe Quantum Wells," $21^{st}$ International Conference on Thermoelectrics, 2002, IEEE, Long Beach, CA, 280-283.

Rogacheva et al., "Effect of non-stoichiometry on oxidation processes in n-type PbTe thin films," Thin Solid Films, 2003, 423(257-261).

(56) References Cited

OTHER PUBLICATIONS

Rogacheva et al., "Quantum size effects in IV-VI quantum wells," Physica E, 2003, 313-315.

Sun et al., "Theoretical Modeling of the Thermoelectric Figurte of Merit In $Si/Si1-_xGe_x$ Quantum Well Structures," $17^{th}$ International Conference on Thermoelectrics, IEEE, 1998, Nagoya, Japan, 47-50.

Sur et al., "Thermoelectric Properties of p-type PbTe/PbEuTe Quantum Well Structures," $22^{nd}$ International Conference on Thermoelectrics, 2003, IEEE, 403-406.

Wagner et al., "Multilayer Thermoelectric Films: A Strategy for the Enhancement of ZT," The American Society of Mechanical Engineers, Orlando, Florida, IECEC Paper No. CT-320, ASME 1995, 3:87-92.

ZT3 Brochure, "ZT3—Comparison for quantum Well Materials (sandwich)," Figures 1-3, 3 pages.

Miura et al., "Texture and thermoelectric properties of hot-extruded $Bi_2Te_3$ compound," Materials Science and Enginering, 2000, A277, 244-249.

Final Office Action mailed Nov. 5, 2009 in copending U.S. Appl. No. 11/301,285, 16 pages.

Notice of Allowance mailed Apr. 6, 2009, in copending U.S. Appl. No. 11/777,112, 11 pages.

Written Opinion and International Search Report dated Feb. 23, 2009, in related PCT/US2008/009562, 7 pages.

* cited by examiner

X-ray diffraction pattern of a glass clad PbTe nano-array

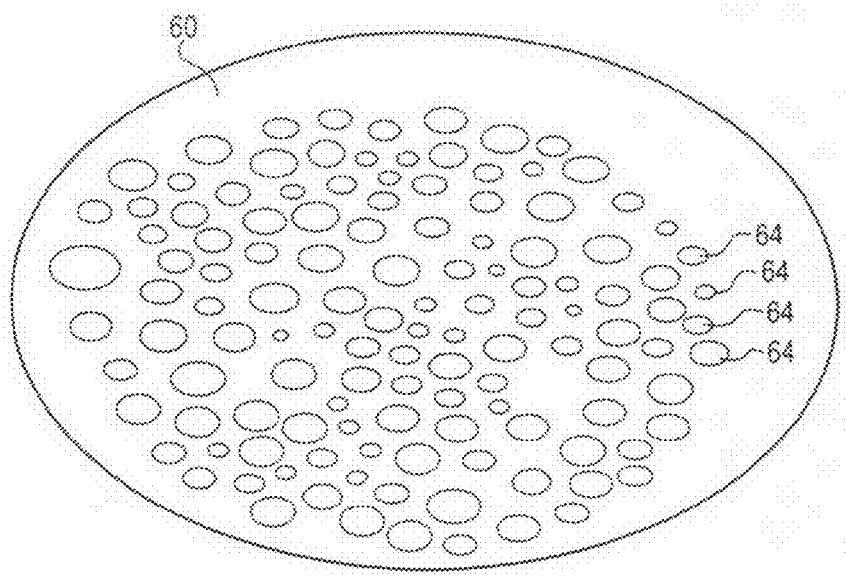
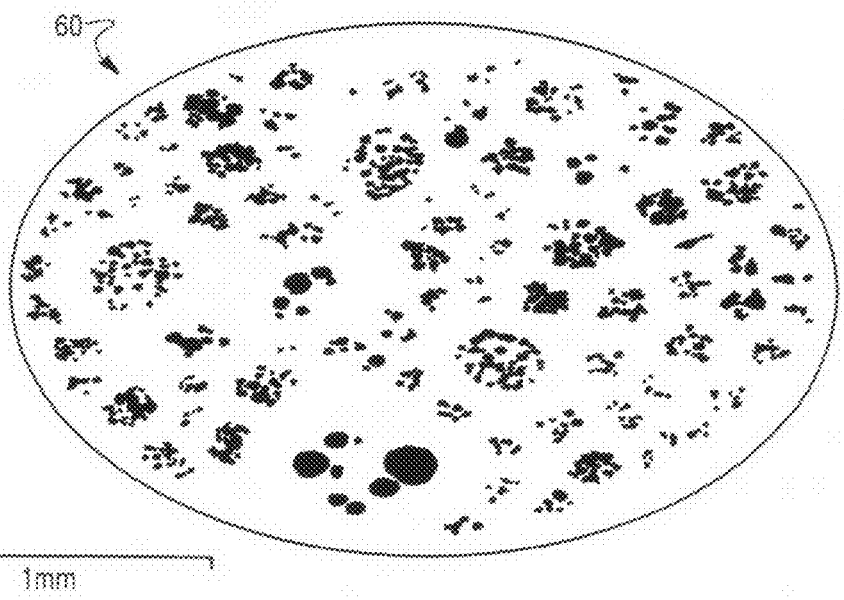

DC resistance of a PbTe button (5.2 mm thick) prepared from the first-draw fibers at 300K DC resistance of a glass-clad PbTe button (2.78mm thick) prepared from fibers following second-draw at 300K DC resistance of a PbTe button (2.09 mm) prepared from third-draw fibers at 300K Resistivity of 55 μm

| | |
|---|---|
| 300 K | 0.001 Ω.cm |
| 360 K | 0.002 Ω.cm |
| 456 K | 0.016 Ω.cm |
| 551 K | 0.042 Ω.cm |
| 651 K | 0.023 Ω.cm |
| 751 K | 0.018 Ω.cm |

| T(K) | ρ (Ω.cm) |
|---|---|
| 300 | 9.60E-02 |
| 350 | 8.60E-02 |
| 400 | 8.95E-02 |
| 450 | 6.93E-02 |
| 500 | 4.42E-02 |
| 550 | 2.15E-02 |
| 600 | 1.66E-02 |
| 650 | 4.64E-03 |
| 700 | 1.39E-03 |

| Resistivity | | |
|---|---|---|
| Temperature (K) | Nominal diameter (um) | Resistivity (ohm.cm) |
| 725 K | 2.2 | 1.92E-03 |
| 725 K | 2.2 | 1.18E-03 |
| 725 K | 1.7 | 1.94E-03 |
| 725 K | 2.2 | 9.74E-04 |
| 725 K | 2.2 | 2.21E-03 |
| 725 K | 2.2 | 2.19E-03 |
| 725 K | 2.2 | 2.01E-03 |
| 725 K | 2.2 | 1.90E-03 |
| 725 K | 2.2 | 1.69E-03 |
| 725 K | 2.2 | 1.88E-03 |
| 725 K | 2.2 | 2.30E-03 |
| 725 K | 2.2 | 2.04E-03 |
| 725 K | 2.2 | 1.93E-03 |
| 725 K | 2.2 | 1.75E-03 |
| 725 K | 2.2 | 2.18E-03 |
| 725 K | 2.2 | 1.79E-03 |
| 725 K | 2.2 | 1.70E-03 |
| 725 K | 2.2 | 1.93E-03 |
| 725 K | 2.2 | 2.15E-03 |
| 725 K | 2.2 | 1.87E-03 |
| | Average | 1.86E-03 |
| | Std Dev | 3.36E-04 |

*FIG. 15A*

| Thermal Conductivity | | |
|---|---|---|
| Diameter (um) | Thermal Conductivity (W/mK) | Temperature (K) |
| 1.7 | 0.938 | 725 K |
| 2.2 | 1.01 | 725 K |
| 2.2 | 1 | 700 K |
| 2.2 | 1 | 701 K |
| 2.2 | 0.99 | 725 K |
| 2.2 | 0.92 | 725 K |
| 2.2 | 1.04 | 725 K |
| 2.2 | 1.07 | 725 K |
| 2.2 | 1.09 | 725 K |
| 2.2 | 0.94 | 725 K |
| 2.2 | 0.97 | 725 K |
| 2.2 | 1.09 | 725 K |
| | Average | 1.00E+00 |
| | Std Dev | 5.64E-02 |

*FIG. 15B*

| Thermopower | | |
|---|---|---|
| Diameter (μm) | S (μV/K) | Temperature (K) |
| 2.2 | 263 | 725 K |
| 2.2 | 256 | 700 K |
| 2 | 307 | 700 K |
| 2.2 | 247 | 725 K |
| 2.3 | 240 | 725 K |
| 2.3 | 425 | 725 K |
| 2.2 | 259 | 725 K |
| 2.2 | 298 | 725 K |
| 2.2 | 256 | 725 K |
| 2 | 230 | 725 K |
| 2.2 | 258 | 725 K |
| 2.2 | 260 | 725 K |
| 2.2 | 261 | 725 K |
| 2.2 | 248 | 725 K |
| 2.25 | 249 | 725 K |
| 2.3 | 242 | 725 K |
| 2.2 | 244 | 725 K |
| 2.2 | 243 | 725 K |
| | Average | 2.74E+02 |
| | Std Dev | 4.99E+01 |

*FIG. 15C*

| Draw ID | Diameter (μm) | ρ (Ω.cm) | S (μV/K) | κ (W/mK) | T (K) | ZT |
|---|---|---|---|---|---|---|
| Draw of Exp 1 | | | | | | |
| Wire 1-1 | 2.2 | 1.92E-03 | 256 | 1 | 700 | 2.39 |
| Wire 1-2 | 2.2 | 1.71E-03 | 240 | 1.01 | 725 | 2.42 |
| Draw of Exp 2 | | | | | | |
| Wire 2-1 | 2.2 | 2.21E-03 | 258 | 0.99 | 725 | 2.21 |
| Wire 2-2 | 2.2 | 2.19E-03 | 260 | 0.92 | 725 | 2.43 |
| Wire 2-3 | 2.2 | 2.01E-03 | 261 | 1.09 | 725 | 2.25 |
| Wire 2-4 | 2.2 | 1.93E-03 | 248 | 1.06 | 725 | 2.18 |
| Wire 2-5 | 2.25 | 2.04E-03 | 249 | 1.07 | 725 | 2.06 |
| Wire 2-6 | 2.3 | 2.30E-03 | 242 | 0.923 | 725 | 2.00 |
| Draw of Exp 3 | | | | | | |
| Wire 3-1 | 2.2 | 2.18E-03 | 244 | 0.973 | 725 | 2.03 |
| Wire 3-2 | 2.2 | 2.04E-03 | 243 | 1.09 | 725 | 1.93 |
| | | | | | ZT Average: | 2.19 |
| S, ρ and κ measured on samples from same draw | | | | | Std. Dev: | 0.18 (8%) |

*FIG. 15D*

METHODS OF DRAWING WIRE ARRAYS

This application is a continuation-in-part of U.S. patent application Ser. No. 11/301,285, filed Dec. 9, 2005, and this application also claims priority to U.S. provisional application Ser. No. 61/061,310, filed Jun. 13, 2008, all of which are incorporated herein by reference in their entirety.

FIELD OF THE INVENTION

The presently claimed invention is directed to methods of producing thermoelectric devices and more particularly to methods of drawing high density wire arrays in a glassy matrix.

BACKGROUND

Thermoelectric materials generate electricity when subjected to a thermal gradient and produce a thermal gradient when electric current is passed through them. Scientists have been trying to harness practical thermoelectricity for decades because practical thermoelectricity could, inter alia: (1) replace fluorocarbons used in existing cooling systems such as refrigerators and air conditioners; and (2) reduce harmful emissions during thermal power generation by converting some or most of the waste heat into electricity. However, the promise of practical thermoelectricity has not yet been fulfilled. One problem is that, because of its low efficiency, the industry standard in thermoelectric technology cannot be functionally integrated into everyday heating and cooling products and systems.

Bulk form thermoelectric devices such as thermoelectric generators (TEG), thermoelectric refrigerators (TER), and thermoelectric heat pumps are used for the direct conversion of heat into electricity, or for the direct conversion of electricity into heat. However, the efficiency of energy conversion and/or coefficient of performance of these bulk form thermoelectric devices are considerably lower than those of conventional reciprocating or rotary heat engines and vapor-compression systems. In view of these drawbacks and the general immaturity of the technology, bulk form thermoelectric devices have not attained immense popularity.

Early thermoelectric junctions were fashioned from two different metals or alloys capable of producing a small current when subjected to a thermal gradient. A differential voltage is created as heat is carried across the junction, thereby converting a portion of the heat into electricity. Several junctions can be connected in series to provide greater voltages, connected in parallel to provide increased current, or both. Modern thermoelectric generators can include numerous junctions in series, resulting in higher voltages. Such thermoelectric generators can be manufactured in modular form to provide for parallel connectivity to increase the amount of generated current.

In 1821, Thomas Johann Seebeck discovered the first thermoelectric effect, referred to as the Seebeck effect. Seebeck discovered that a compass needle is deflected when placed near a closed loop made of two dissimilar metals, when one of the two junctions is kept at a higher temperature than the other. This established that a voltage difference is generated when there is a temperature difference between the two junctions, wherein the voltage difference is dependent on the nature of the metals involved. The voltage (or EMF) generated per ° C. thermal gradient is known as Seebeck coefficient.

In 1833, Peltier discovered the second thermoelectric effect, known as the Peltier effect. Peltier found that temperature changes occur at a junction of dissimilar metals, whenever an electrical current is caused to flow through the junction. Heat is either absorbed or released at a junction depending on the direction of the current flow.

Sir William Thomson, later known as Lord Kelvin, discovered a third thermoelectric effect called the Thomson effect, which relates to the heating or cooling of a single homogeneous current-carrying conductor subjected to a temperature gradient. Lord Kelvin also established four equations (the Kelvin relations) correlating the Seebeck, Peltier and Thomson coefficients. In 1911, Altenkirch suggested using the principles of thermoelectricity for the direct conversion of heat into electricity, or vice versa. He created a theory of thermoelectricity for power generation and cooling, wherein the Seebeck coefficient (thermo-power) was required to be as high as possible for best performance. The theory also required that the electrical conductivity to be as high as possible, coupled with a minimal thermal conductivity.

Altenkirch established a criterion to determine the thermopower conversion efficiency of a material, which he named the power factor (PF). The latter is represented by the equation: $PF=S^2*\sigma=S^2/\rho$, where S is the Seebeck coefficient or thermo-power, $\sigma$ is the electrical conductivity and $\rho$ ($=1/\sigma$) is the electrical resistivity. Altenkirch was thereby led to establish the equation: $Z=S^2*\sigma/k=S^2/\rho*k=PF/k$, wherein Z is the thermoelectric figure of merit having the dimensions of $K^{-1}$. The equation can be rendered dimensionless by multiplying it by the absolute temperature, T, at which the measurements for S, $\rho$ and k are conducted such that the dimensionless thermoelectric figure of merit or ZT factor equals $(S^2*\sigma/k)T$. It follows that to improve the performance of a thermoelectric device, the power factor can be increased as much as possible, whereas k (thermal conductivity) can be decreased as much as possible.

The ZT factor of a material indicates its thermopower conversion efficiency. Forty years ago, the best ZT factor in existence was about 0.6. After four decades of research, commercially available systems are still limited to ZT values that barely approach 1. It is generally recognized that a ZT factor greater than 1 would open the door for thermoelectric power generation to begin supplanting existing power-generating technologies, traditional home refrigerators, air conditioners, and more. Indeed, a practical thermoelectric technology with a ZT factor of even 2.0 or more can likely lead to the production of the next generation of heating and cooling systems. In view of the above, a need exists for a method for producing practical thermoelectric technology that achieves an increased ZT factor of around 2.0 or more.

The ability to convert energy efficiently between different forms is one recognizable symbol of advances in science and engineering. Conversion of thermal energy to electrical power is important to the energy economy, where even marginal improvements in efficiency and conversion methods can have enormous impact on monetary savings, energy reserves, and environmental effects. Similarly, electromechanical energy conversion lies at the heart of many modern machines. In view of the continuing quest for miniaturization of electronic circuitry, nanoscale devices can play a role in energy conversion and also in the development of cooling technology of microelectronic circuitry where a large amount of heat is generated.

SUMMARY OF THE INVENTION

In view of the foregoing, a method for generating practical thermoelectric devices from structures possess significantly larger ZT factors as compared to those of thermoelectrically active materials in bulk form. Such devices may include a ZT factor of for example about 1.5 and higher. The embodiments of the invention also provide a method for producing practical electrical devices that may be cost-effectively integrated into everyday heating and cooling products.

One preferred embodiment is directed to structures formed from wires of thermoelectrically active materials that are substantially one-dimensional, having a diameter that is significantly smaller than their length. The wires from which these structures are composed have a diameter of about 5 µm or less, such as about 3 µm or less, including 0.1 µm to about 4 µm, such as about 0.5 µm to about 3 µm, for example about 1 µm to about 2 µm. Alternatively, the wires can have a diameter in a nanometer range. "Wires" are also referred to as "fibers" herein. The "cables," "arrays," "heterostructures," or "composites" described herein can comprise a plurality of wires, which include at least one thermoelectrically active material and a glassy material, which acts as an electrical insulator for the thermoelectrically active material, which is also referred to herein as the "thermoelectric material."

In another embodiment, a large concentration (e.g., $10^6$-$10^{10}$/cm$^2$) of wires embedded in a suitable glass form a cable, wherein the wires extend over large distances along the length of the cable without coming in contact with other wires. The thermoelectrically active material may comprise a suitable metal, alloy, or semiconductor material, which maintains the integrity of the interface between the thermoelectric material and the glassy material without any appreciable smearing and/or diffusion of the thermoelectric material. The thermoelectrically active material (or thermoelectric material) can be doped or undoped. For example, it can be a p-type or n-type material, or separate cables comprising both n and p-type materials.

Another embodiment provides a process of fabricating cables, including increasing the population of thermoelectric wires to more than $10^9$/cm$^2$ of the cross-section of the cable. Each cable includes an array of wires having a distribution of diameters, wherein the variation in wire diameter may be reduced by employing automated draw-towers, which are commonly employed in the wire-optic industry for drawing optical wires.

Optionally, a cable produced in one embodiment comprises at least one thermoelectric wire embedded in an electrically insulating material, wherein the thermoelectric material exhibits quantum confinement. However, the wire diameter may be sufficiently large so that there is no quantum confinement. The cable comprises a plurality of wires such that there is electrical connectivity between the ends of all the wires. Alternatively, there is electrical connectivity between some, but not all of, the wires of the cable. The glass cladding for the cable preferably comprises an electrically insulating material such as pyrex, borosilicate, aluminosilicate, quartz, or a glass having lead oxide, tellurium dioxide, and silicon dioxide as its main constituents. The thermoelectric material may be chosen from the group consisting of a metal, a semi-metal, an alloy, and a semiconductor, such that the thermoelectric material exhibits electrical connectivity.

One embodiment provides a method of drawing a thermoelectrically active material in a glass cladding, comprising sealing off one end of a glass tube such that the tube has an open end and a closed end, introducing the thermoelectrically active material inside the glass tube and evacuating the tube by attaching the open end to a vacuum pump, heating a portion of the glass tube such that the glass partially melts and collapses such that the partially melted glass tube provides an ampoule containing the thermoelectric material, introducing the ampoule containing the thermoelectric material into a heating device, increasing the temperature within the heating device such that the glass tube is heated enough for it to be drawn, and drawing a wire of glass clad thermoelectrically active material. The method may further comprise bunching the wires of glass clad thermoelectrically active material together and redrawing one or more times in succession to produce a multi-core cable having a plurality of individual thermoelectric wires that are insulated from each other by the glass cladding.

Additionally, the above-described method may further comprise the steps of breaking the glass clad wires into shorter pieces, introducing the pieces of glass clad wires into another glass tube having a sealed end and an open end, heating a portion of the glass tube such that the glass partially melts and collapses such that the partially melted glass tube provides an ampoule containing the pieces of glass clad wires, introducing the ampoule into a heating device, increasing the temperature within the heating device such that the glass tube is heated enough for it to be drawn and drawing wires of glass clad thermoelectrically active material to produce a cable having a plurality of multi-core wires.

BRIEF DESCRIPTION OF THE DRAWINGS

FIG. 4 is an enlarged cross-sectional view of the glass-clad PbTe-based cable of FIG. 3 taken along line 3A-3A.

FIG. 5 is a cross-sectional view of the glass-clad PbTe-based cable of FIG. 3 after a second drawing of the PbTe wires.

FIGS. 15A-15D are charts providing thermal properties, including electrical resistivity (15A), thermal conductivity (15B), thermopower (15C), and ZT value (15D) of various samples measured at 725K.

DETAILED DESCRIPTION OF THE EMBODIMENTS

Figure 1:
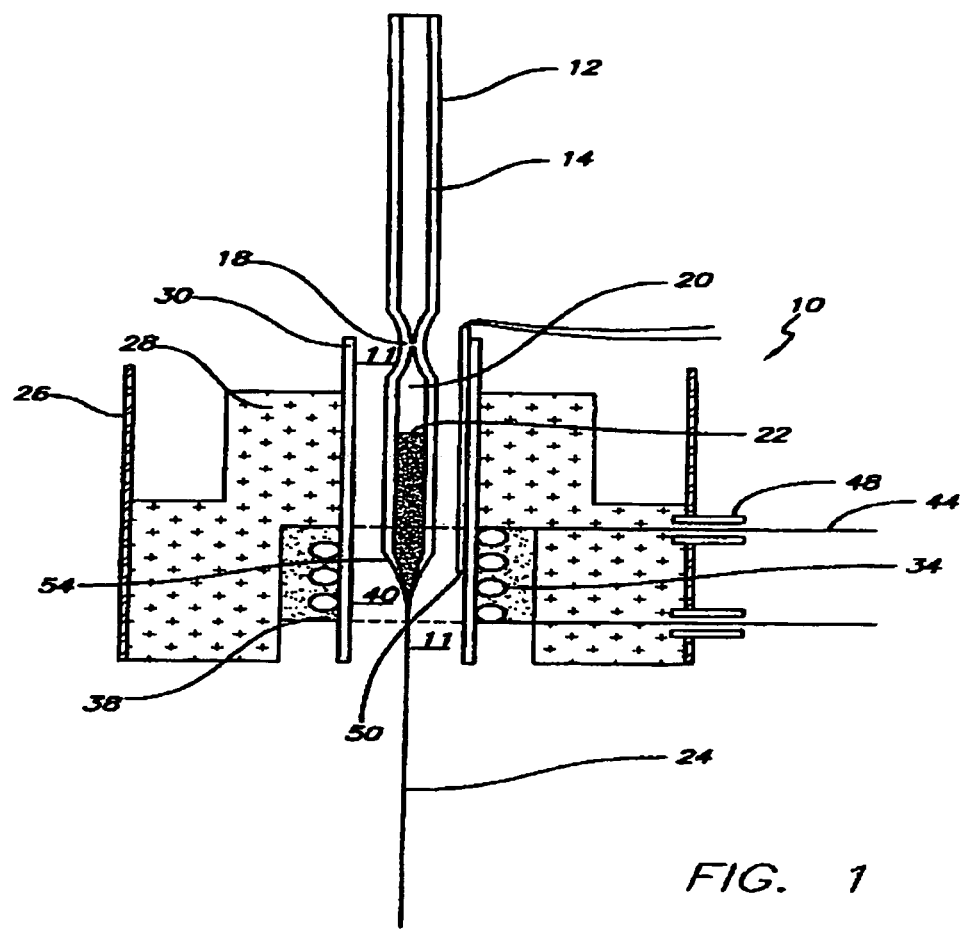
FIG. 1 is a cross-sectional view of a tubular furnace for drawing a thermoelectrically active material embedded in a glass cladding in one embodiment.

In the following paragraphs, the presently claimed inventions are described by way of example with reference to the attached drawings. Throughout this description, the preferred embodiment and examples shown should be considered as exemplars, rather than as limitations.

Before starting a description of the Figures, some terms are defined herein.

Chalcogenides: Group VI elements of the periodic table.

Chemical Vapor Deposition: Deposition of thin films (usually dielectrics/insulators) on wafer substrates by placing the wafers in a mixture of gases, which react at the surface of the wafers. This can be done at medium to high temperature in a furnace, or in a reactor in which the wafers are heated but the walls of the reactor are not. Plasma enhanced chemical vapor deposition avoids the need for a high temperature by exciting the reactant gases into a plasma.

Doping: Deliberately adding a very small amount of foreign substance to an otherwise very pure semiconductor crystal. These added impurities give the semiconductor an excess of conducting electrons or an excess of conducting holes (the absence of conducting electrons).

Efficiency: Efficiency is the power generated by a system divided by the power fed into it, a measure of how well a material converts one form of energy into another. Efficiency stands at a mere 8 to 12% for bulk form thermoelectric devices that are currently available or on the near horizon.

Figure of Merit: The thermoelectric figure of merit, ZT, is given by $ZT=(S^2*\sigma/k)*T$, where S is the Seebeck coefficient, T is the absolute temperature, $\sigma$ is the electrical conductivity, and k is the thermal conductivity.

Lead Telluride: PbTe is one of the most commonly used thermoelectric materials other than $Bi_2Te_3$. PbTe is typically used for power generation because this material exhibits its highest ZT at temperatures between about 400° C. and 500° C. and has an effective operating range of about 200° C. and about 500° C.

Quantum Confinement: Quantum Confinement takes place when carriers of electricity (electrons or holes) are confined in space by reducing the size of the conductor. For example, a very thin conducting film reduces the freedom of a carrier by limiting its freedom to propagate in a direction perpendicular to the plane of the film. The film is said to be a two-dimensional (2-D) structure and the carrier in such a film is said to be quantum confined in one direction. Carrier transport can take place in the two directions available in the plane of the film. In a wire, quantum confinement can occur in two directions and the only direction available for carrier transport is along the length of the wire.

Seebeck Coefficient: The electromotive force generated in a material when it is subjected to a thermal gradient and is normally expressed as microvolts per degree Kelvin. The thermoelectric power, or Seebeck coefficient, of a material has a large role in determining its ZT factor.

Thermal Conductivity: Thermal conductivity is an inherent property of a material that specifies the amount of heat transferred through a material of unit cross-section and unit thickness for unit temperature gradient. Though thermal conductivity is an intrinsic property of a medium, it depends on the measurement temperature. The thermal conductivity of air is about 50% greater than that of water vapor, whereas the thermal conductivity of liquid water is about 25 times that of air. Thermal conductivities of solids, especially metals, are thousands of times greater than that of air.

Solid-state thermoelectric coolers and thermoelectric generators in structures have recently been shown to be capable of enhanced thermoelectric performance over that of corresponding thermoelectric devices in bulk form. It has been demonstrated that when certain thermoelectrically active materials (such as PbTe, $Bi_2Te_3$ and SiGe) are reduced in size, the ZT factor can increase dramatically. Without wishing to be bound by any particular theory, it is believed that this can be attributed to an increase in the electrical conductivity, or equivalently a decrease in the electrical resistivity. Illustrative examples of the electrical resistivity between a PbTe wire with a diameter of 55 microns, one with 4.8 microns, and another with a diameter of 2.25 microns are provided in FIGS. 12, 13, and 14, respectively. It can be seen that the electrical resistivity has decreased with decreasing size of the diameter. The thermoelectrically active material is reduced in thickness or diameter to less than about 10 microns to enhance its properties without necessarily producing quantum confinement. In this manner, the thermoelectric efficiency of the thermoelectrically active material can be enhanced. The thermoelectrically active material is also referred to herein as the "thermoelectric material." The cladding material can comprise a suitable glass such as a glass comprising an amorphous material having no long range ordering of its constituent atoms.

One embodiment provides a method of producing practical thermoelectricity by developing wires capable of exhibiting high ZT values. As explained hereinabove, the equation for the thermoelectric figure of merit, Z, can be rendered dimensionless by multiplying it by an absolute temperature, T, such as the temperature of the hot junction of the thermoelectric device. It follows that the dimensionless thermoelectric figure of merit, $ZT=(S^2*\sigma/k)*T$, can be used in the evaluation of the performance and energy conversion efficiency, of any thermoelectric material or device.

For wires of PbTe, if the bulk thermal conductivity (k) of PbTe is considered, the ZT factor at 750 K can be still very high (i.e., ZT of around 2.0 or more) using $ZT=(S^2*\sigma/k)*T$. ZT factors can increase with temperatures between about 300 K and 750 K. For PbTe-based thermoelectric wires, the value of $S^2*\sigma$ tends to peak at a certain level with the ZT factors increasing with decreasing wire width. However, after a certain wire width is reached, ZT factors begin to fall with decreasing wire width. The PbTe-based wires described herein may be easily tailored to exhibit n-type or p-type conduction, either by changing the stoichiometry of Pb and Te or by adding p or n type dopants.

Numerous thermoelectric materials, including PbTe, are sensitive to oxygen, which can degrade thermoelectric performance. Thus, it is advantageous to have such thermoelectric materials sealed off and protected from oxygen contamination within the target environment range. Of course, a thermoelectric device is not commercially viable if it cannot withstand the elements and environment it is intended to function under.

Although PbTe is the preferred thermoelectric material, other thermoelectric materials, such as $Bi_2Te_3$, SiGe, ZnSb, and zinc cadmium antimonide, such as $Zn_{3.2}Cd_{0.3}Sb_3$, or a combination thereof may be employed. The thermoelectric material may initially be in any convenient form, such as granules (i.e., particles) or powder.

Once wire-drawn cables are produced using the methods described above, the electrical conductivity ($\sigma$) and thermoelectric power (S) can be measured, and the variation of the parameter, $S^2*\sigma$, can be determined. The parameter, $S^2*\sigma$, is determined experimentally, multiplied by the measurement temperature (in K) and divided by the known thermal conductivity (k) to provide the ZT values of the wires.

Testing of the glass cladding without embedded wires using the Van der Pauw 4-probe instrument showed that the sample showed high electrical resistance such that the instrument did not detect electrical conductivity. Similarly, the measurement of thermopower using a conventional method (e.g. by employing the Seebeck coefficient determination system, marketed by MMR Technologies, Mountain View, Calif.) did not produce any result on account of the high resistivity of the glass cladding. However, the electrical conductivity and thermoelectric power of PbTe-embedded cables was readily measurable, indicating that the measured values of electrical conductivity and thermoelectric power were attributable to the continuous wires along the length of the cable.

One thermoelectric material for the wire cables of the present invention is PbTe because of its advantageous thermoelectric properties and reasonable cost. Using the known bulk thermal conductivity value for PbTe known in the art, the calculated ZT $((S^2\sigma/k)*T)$ factor at 750 K was determined to be greater than 2.5. The power factor, $S^2\sigma$, of PbTe generally exhibits a tendency to peak at a certain wire width. Given that the best known ZT factors for bulk PbTe is about 0.5, the resultant ZT factors of around 2.0 or more is considered to be significantly enhanced. Without wishing to be bound by any particular theory, this increase can be due to a size effect or possible quantum confinement if the size is sufficiently small. Illustrative examples of the size effect upon the thermal and electrical properties are provided in FIGS. 10 to 14, as will be described in more detail below. The ZT factor increases with decreasing wire width until this maximum value is reached, and then the ZT factor begins to decrease with further decrease in wire width. As would be appreciated by those of ordinary skill in the art, other thermoelectric materials having suitable thermoelectric properties (e.g., $Bi_2Te_3$) may be employed.

The diameter of the wires can be less than about 5 μm, such as between about 0.1 μm and about 4 μm, or such as between 0.5 μm and about 3 μm, for example between about 1 and about 2 μm. In cases where the cross-section of the wires is not circular, the term "diameter" in this context refers to the average of the lengths of the major and minor axis of the cross-section of the wires, with the plane being normal to the longitudinal axis of the wires.

The cables in one embodiment are manufactured to exhibit a high uniformity in diameter from end to end. According to some embodiments of the invention, the maximum diameter of the glass cladding may vary in a range of less than about 10% over the length of the cable. For less precise applications, the diameter of the wires may vary in a larger range (e.g., 0.1-5 μm, depending on the application). Electrically, the glass is preferably several orders of magnitude more electrically insulating (i.e., with a higher electrical resistivity) than the thermoelectric material it is employed to clad. The cables generally comprise a plurality of semiconducting wires, wherein the doping and composition of each wire can be controlled by changing the composition of the thermoelectric material to yield a wire that exhibits either a p-type or n-type thermoelectric behavior. One cable can contain p-type wires, while another cable can contain n-type wires. Both cables can be incorporated into a thermoelectric device as p-type and n-type legs of the device. Advantageously, the cables may be used to develop superior thermoelectric devices in a cost-effective manner.

In one embodiment, a method of drawing a thermoelectric material in glass cladding involves drawing the glass-clad thermoelectric material to form individual wires of thermoelectric materials, which are preferably about 10 μm or less in diameter, such as between about 0.001 μm and about 10 μm, or about 0.1 μm to about 5 μm, or about 0.5 μm to about 3 μm, or such as about 1 μm to about 2 μm. As would be appreciated by those of ordinary skill in the art, each cable may have a diameter greater than 500 microns. If desired, cable diameters may be brought below 500 μm, such as down to about 50 μm to about 200 μm, such as about 70 μm to about 100 μm by repeatedly drawing wire bundles of individual wires, and the concentration of wires in a cross-section of the cable may be increased to about $10^5/cm^2$ or greater, such as about $10^9/cm^2$.

The method of drawing a thermoelectric material in glass cladding may further comprise bunching the cable together with other cables and redrawing several times in succession to produce a multi-core cable comprising glass-clad thermoelectric wires. By way of example, the material to form the wires of a cable may comprise PbTe, $Bi_2Te_3$, SiGe, ZnSb, and $Zn_{3.2}Cd_{0.3}Sb_3$. The resulting cable can comprise a multi-core cable having a plurality of individual wires that are insulated from each other by the glass cladding. A particular glass cladding may be chosen to contain a specific composition to match the physical, chemical, thermal, and mechanical properties of a selected thermoelectric material. The glass cladding preferably has an electrical resistivity several orders of magnitude higher than the metal, alloy, or semiconductor material that forms the thermoelectric wires. Suitable commercial glasses for most applications include, but are not limited to, pyrex, vycor, and quartz glass.

In one embodiment, the metal, alloy or semiconductor material that forms the wires is varied to render a cable either n-type or p-type, such that individual cables may be used as the n-type and p-type components (e.g., legs) of a thermoelectric device where the legs are electrically connected on one end. Optionally, the cables may be induced to exhibit quantum confinement by reducing the thickness or the diameter of the wires to a predetermined range, thereby increasing the efficiency of thermopower generation.

Method of Drawing a Thermoelectric Material in a Glass Cladding:

Referring to FIG. 1, vertical tube furnace 10 is employed to provide heat for drawing glass-clad thermoelectric wires. In particular, vertical tube furnace 10 includes a central lumen 11 for receiving a preform 12 comprising a glass tube 14 that is sealed at an area of reduced cross-section 18 to form vacuum space 20 that is at least partially filled with thermoelectric material 22. The furnace is used to melt the thermoelectric material 22 and glass tube 14 in preparation for one or more drawing operations for producing glass-clad thermoelectric wires 24.

With further reference to FIG. 1, vertical tube furnace 10 comprises furnace shroud 26, thermal insulation 28 and muffler tube 30. Suitable materials for muffler tube 30 include conductive metals such as aluminum. Vertical tube furnace 10 further comprises one or more heater coils 34 embedded therein. More precisely, heater coils 34 are disposed between muffler tube 30 and thermal insulation 28, and refractory cement 38 is disposed between heater coils 34 and thermal insulation to direct the heat produced by heater coils 34 inwardly to form a hot zone 40 within muffler tube 30. Heater coils 34 are provided with leads 44 that may be insulated using a ceramic insulator 48. Additionally, a thermocouple probe 50 is provided for measuring the temperature within hot zone 40, which may include a length of about one inch.

A method of drawing a thermoelectrically active material 22 comprising an array of metal, alloy, or semiconductor rods embedded in a glass cladding is herein described. Initially, a suitable thermoelectric material 22 is selected. The preferred thermoelectric material comprises PbTe that is initially in granular form. Additional suitable thermoelectric materials include, but are not limited to, $Bi_2Te_3$, SiGe, ZnSb, or $Zn_{3.2}Cd_{0.3}Sb_3$. The next step involves selecting a suitable material for forming the glass tubing 14. The glass material preferably is selected to have a wire drawing temperature range that is slightly higher than the melting temperature of the thermoelectric material (e.g., ≥920° C. for PbTe). Vertical tubular furnace 10 is then employed to seal off one end of glass tubing 14. Alternatively, a blowtorch or other heating device may be used to seal off the glass tubing 14 and create vacuum space 20.

After sealing off one end of the glass tubing 14, the next steps involve introducing the thermoelectric granules inside the vacuum space 20 and evacuating the tube by attaching the open end of the glass tube to a vacuum pump. While the vacuum pump is on, an intermediate portion of the glass tubing 14 is heated such that the glass partially melts and collapses under the vacuum. The partially melted glass tube provides an ampoule 54 containing the thermoelectric material 22 to be used in a first drawing operation. The next step involves introducing the end of ampoule 54 containing the thermoelectric material 22 into the vertical tube furnace 10. In the illustrated embodiment, the tubular furnace 10 is configured such that the ampoule 54 is introduced vertically, wherein the end of the ampoule 54 containing the thermoelectric granules is disposed within hot zone 40 adjacent to heater coils 34.

Once the ampoule 54 is properly disposed in vertical tube furnace 10, the temperature is increased such that the glass encasing the thermoelectric granules is heated enough for it to be drawn, as is done in a conventional glass draw-tower, which is commonly known in the art. As discussed hereinabove, the composition of the glass is preferably chosen such that the wire drawing temperature range is slightly greater than the melting point of the thermoelectric granules. For example, if PbTe is selected as the thermoelectric material, pyrex glass, or a glass resembling pyrex glass in composition, is a suitable material for drawing the glass with PbTe wires embedded therein. The physical, mechanical, and thermal properties of glass tubing 14 and thermoelectric material 22 will have a bearing on the properties of the resulting cables. Glasses exhibiting a minimal deviation of these properties with respect to those of the thermoelectric material 22 are preferably chosen as the cladding material.

The above-described glass tubing 14 may comprise commercially available pyrex tubing having a 7 mm outside diameter and a 2.75 mm inside diameter, wherein the tube is filled with PbTe granules over a length of about 3.5 inches. Evacuation of glass tubing 14 may be achieved overnight under a vacuum of about 30 mtorr. After evacuation, the section of glass tubing 14 containing the thermoelectric material 22 is heated gently with a torch for several minutes to remove some residual gas, and then the glass tubing 14 is sealed under vacuum above the level of thermoelectric material 22.

In operation, vertical tube furnace 10 is used for drawing the glass-clad thermoelectric wires. Vertical tube furnace 10 includes a short hot zone 40 of about 1 inch, wherein the preform 12 is placed in the vertical tube furnace 10 with the end of the tube slightly below hot zone 40. With the furnace at about 1030° C., the weight from the lower tube end is sufficient to cause glass tubing 14 to extend under its own weight. When the lower end of glass tubing 14 appears at the lower opening of the furnace, it may be grasped with tongs for hand pulling. Preform 12 may be manually advanced periodically to replenish the preform material being used up during the wire drawing process. According to additional embodiments of the present invention, the drawing operation may be performed using an automatic draw-tower that results in very little variation in diameter.

According to further embodiments of the invention, short wire sections may be formed by drawing the heterostructures and then breaking or cutting the heterostructures into shorter pieces. By way of example, these shorter pieces may be machined to be about 3 inches in length. The pieces are then bundled inside another pyrex tube, which is sealed at one end using the vertical tube furnace or using a blowtorch, as described hereinabove. When a suitable number of wires are packed in the tube, the open end is optionally attached to a vacuum pump and an intermediate section is heated. Alternatively, the vacuum may be omitted. This heating causes the glass tube to collapse, thereby sealing the tube and forming an ampoule that allows for a second drawing operation, which produces a cable having a plurality of multi-core wires. After the second drawing operation, the cable is collected and placed in the bore of yet another sealed tube. When the bore is filled with a suitable number of cables, the preform is optionally evacuated and sealed. Cable drawing is then performed on the twice-drawn wires. This process is repeated as needed to obtain a final thermoelectric material diameter of about 5 µm or smaller, such as 0.1-3 µm.

Figure 2:
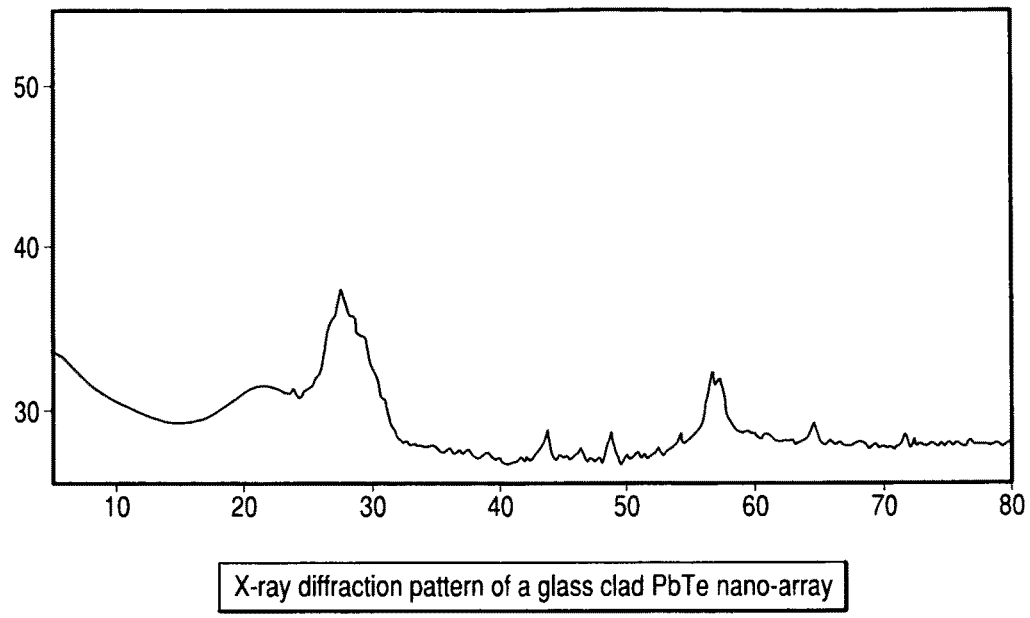
FIG. 2 is an x-ray diffraction pattern of a PbTe-based cable constructed in one embodiment.

Cable Properties:

In order to characterize the electronic properties of bulk and heterostructure cable, it is important to determine the x-ray diffraction characteristics of the glass-clad thermoelectric material. FIG. 2 depicts an x-ray diffraction pattern of a PbTe-based cable constructed in accordance with the principles of the present invention, wherein the characteristic spectrum of PbTe is overlaid on a glassy x-ray diffraction pattern. In particular, the x-ray diffraction pattern clearly indicates the presence of PbTe peaks and a lack of other peaks, thus illustrating that the glass material has neither reacted with PbTe nor devitrified during wire drawing. These peaks are exclusively characteristic to those of PbTe crystals.

Figure 3:
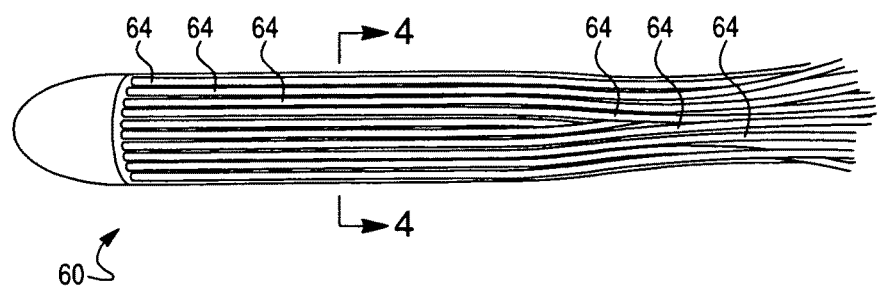
FIG. 3 is a side view of a glass-clad PbTe-based cable constructed in one embodiment.

FIG. 3 depicts a glass-clad PbTe-based cable 60 constructed using the method of drawing a thermoelectrically active material embedded in a glass cladding described hereinabove. Specifically, the cable 60 comprises a plurality of multiple wires 64 that are bundled and fused to form a cable (or button) of virtually any length. This button can be broken, cut or otherwise sectioned to produce a plurality of shorter cables having a predetermined length. FIG. 4 is an enlarged cross-sectional view of the glass-clad PbTe-based cable 60 of FIG. 3 taken along line 3A-3A. Cable 60 includes a plurality of wires 64, has a width of about 5.2 mm, and was produced using a single drawing of the PbTe wires at a temperature of about 300K.

Figure 6:
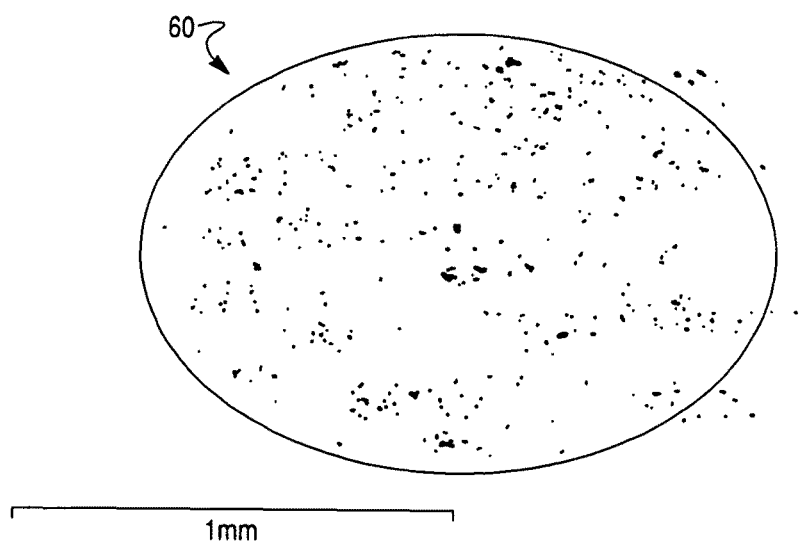
FIG. 6 is a cross-sectional view of the glass-clad PbTe-based cable of FIG. 3 after a third drawing of the PbTe wires.

In one embodiment, the cable 60 is bunched together and redrawn several times in succession to produce a multi-core cable having a plurality of individual thermoelectric wires that are insulated from each other by the glass cladding. FIG. 5 is a cross-sectional view of the glass-clad PbTe-based cable 60 after a second drawing of the PbTe wires. The twice-drawn cable has a width of about 2.78 mm. FIG. 6 is a cross-sectional view of the glass-clad PbTe-based cable 60 after a third drawing of the PbTe wires, wherein the cable has a width of about 2.09 mm.

FIGS. 3-6 illustrate the development of microstructure as the concentration of wires in the cable increases to ~$10^9$/cm². These microstructures may be observed using optical and scanning electron microscopes. By way of example, energy dispersive spectroscopy may be employed to unambiguously indicate the presence of PbTe wires in the glass matrix.

Thermoelectric Property Characterization:

Another embodiment involves the continuity and electrical connectivity of the glass embedded wires along the entire length of the cable. Electrical connectivity is easily demonstrated by determining the resistance of the cable at different thicknesses (i.e., to determine electrical resistivity). In one embodiment, the resistance of the glass cladding, without any thermoelectric wires embedded therein, is about 7 to 8 orders of magnitude higher than that of the continuous thermoelectric wires.

Figure 7:
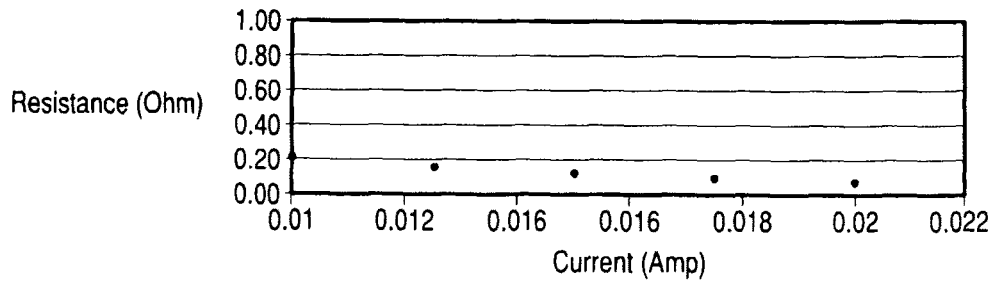
FIG. 7 is a plot illustrating the DC resistance of the PbTe cable of FIG. 4 (after a first drawing of the PbTe wires).
Figure 8:
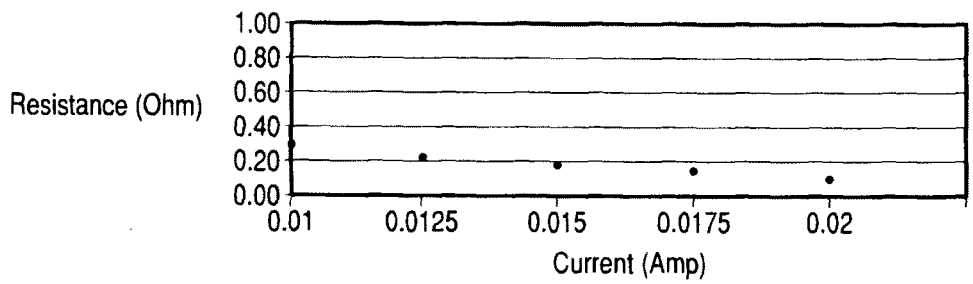
FIG. 8 is a plot illustrating the DC resistance of a PbTe cable of FIG. 5 (after a second drawing of the PbTe wires).
Figure 9:
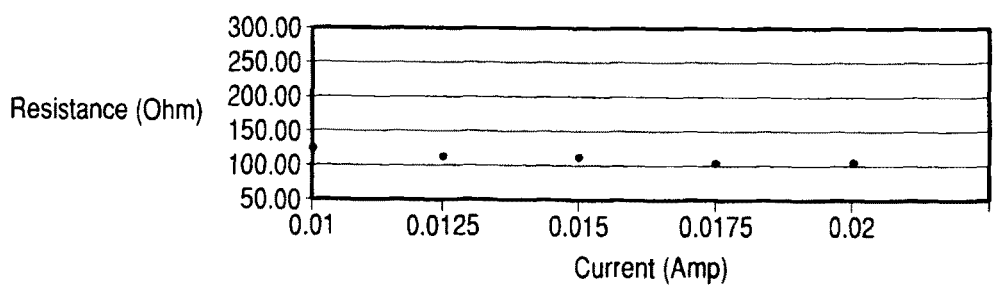
FIG. 9 is a plot illustrating the DC resistance of a PbTe cable of FIG. 6 (after a third drawing of the PbTe wires).

The samples used to determine electrical connectivity of the thermoelectric wires are in the form of "buttons" of PbTe prepared from the preforms following the one of the wire drawing steps. Referring to FIGS. 7-9, the electrical resistivity of the thermoelectrically active material wire embedded in the glass is about 1 ohm-cm or less at room temperature (about 300K). On the other hand, the electrical resistivity of the glass cladding without thermoelectrically active wire material is more than about $10^8$ ohm-cm at the same temperature, which is about 8 orders of magnitude higher than that of the PbTe-embedded cables. This difference in electrical resistance indicates that the glass-clad thermoelectric wires drawn using the methods described herein exhibit electrical connectivity from one end to the other.

FIG. 7 is a plot illustrating the DC resistance of PbTe cable 60 after the first drawing of the PbTe wires, wherein the resistance of the cable (Ohms) is plotted against the electrical current (amps). In particular, the DC resistance of the cable 60 steadily decreases with an increasing current. FIG. 8 is a plot illustrating the DC resistance of the cable 60 after the second drawing of the PbTe wires, while FIG. 9 is a plot illustrating the DC resistance of the PbTe cable 60 after the third drawing of the PbTe wires.

A preferred cable produced in accordance with the principles of the present invention preferably comprises at least one thermoelectric wire embedded in an electrically insulating material. In one non-limiting embodiment, the thermoelectric material comprises a single crystal across the wire diameter (e.g., there are no grain boundaries across the diameter of the wires). In an alternative embodiment, the thermoelectric material comprises a single crystal along the length of the wire, such as substantially the entire length of the wire or a significant portion of the length of the wire, such as along at least about 1 micron, such as at least about 1 mm, for example, about 1 to 10 mm along the length of the wire. In another embodiment, the thermoelectric material of the wire comprises a single crystal in both the length and the across the wire diameter. In one embodiment, the wire comprises polycrystalline microstructure across the diameter and/or along the length of the wire. The polycrystalline microstructure can comprise, for example, a certain preferred crystallographic orientation in at least some of the grains (e.g., more grains have the preferred orientation than would have such orientation in a material with random grain orientation) or a random grain orientation. For example, at least some of the grains in the polycrystalline wire can have the preferred crystallographic orientation either in the wire axial or radial direction.

The preferred cable comprises a plurality of wires that are fused or sintered together such that there is electrical connectivity between all the wires. Alternatively, there is electrical connectivity between some, but not all of, the wires of the cable. The glass cladding for the cable preferably comprises an electrically insulating material comprising a binary, ternary, or higher component glass structure such as pyrex, borosilicate, aluminosilicate, quartz, and lead telluride-silicate. The thermoelectric material maybe chosen from the group consisting of a metal, a semi-metal, an alloy, and a semiconductor, such that the thermoelectric material exhibits electrical connectivity and/or quantum confinement. The ZT factor of the cable is preferably at least 0.5, more preferably at least 1.5, most preferably at 1.5 to 2.5 at about 750K.

In one non-limiting example of an embodiment, a plurality of glass clad PbTe wires with diameters of about 2.2 microns made by the method described above have ZT values ranging from about 1.9 to over about 2.4, with an average ZT factor value of about 2.2 at about 725K (FIG. 15D). As shown in FIG. 15D, the properties of a number of drawn wires (i.e., Wire 1-1, 2-1, . . . etc) in three different sets of experiments (i.e., Draw Experiments 1-3) were measured, and the results for each of the measured drawn wire are provided in each row of FIG. 15D. In another non-limiting example of an embodiment, the properties of a plurality of glass clad PbTe wires with diameters of about 2.2 microns made by the method described above were measured, and the results for each of the measured wire are provided in each row of each FIG. 15A-15C. Note that there is no correspondence among the rows in each of FIGS. 15-15D. As shown in FIG. 15A, the electrical resistivity of some of these wires ranges from about 0.9 mΩ-cm to about 2.5 mΩ-cm, with an average thermal resistivity of about 1.9 mΩ-cm at about 725K. As shown in FIG. 15B, the thermal conductivity of some of these wires ranges from about 0.94 W/mK to about 1.1 W/mK, with an average thermal resistivity of about 1 W/mK at about 725K. As shown in FIG. 15C, the thermopower (i.e., the Seebeck Coefficient) of some of these wires ranges from about 230 μV/K to about 430 μV/K, with an average thermopower of about 274 μV/K at about 725K.

Figure 10:
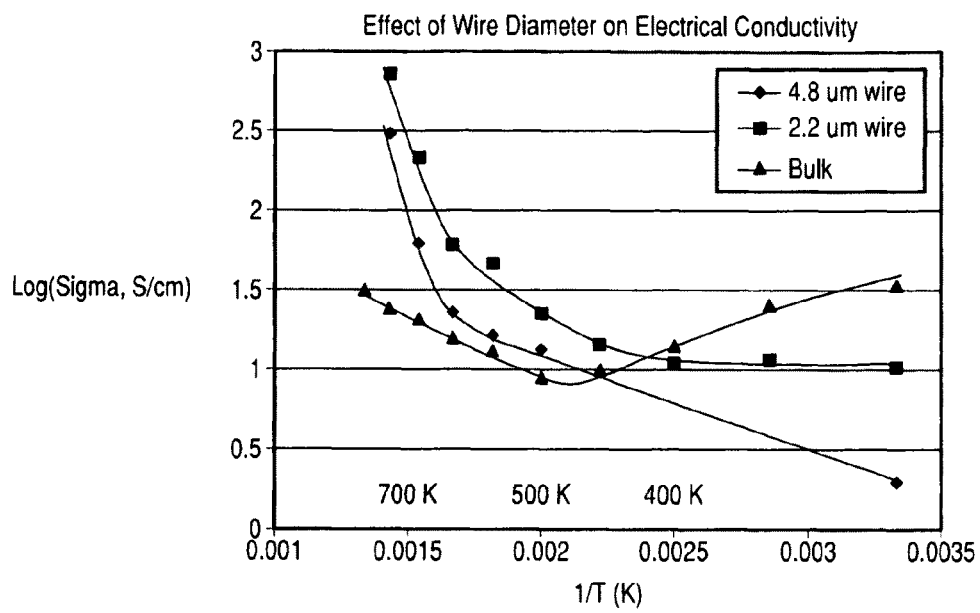
FIG. 10 is a plot of Log conductivity versus inverse temperature, illustrating the size effect upon the electrical conductivity of the wires in one embodiment.
Figure 11:
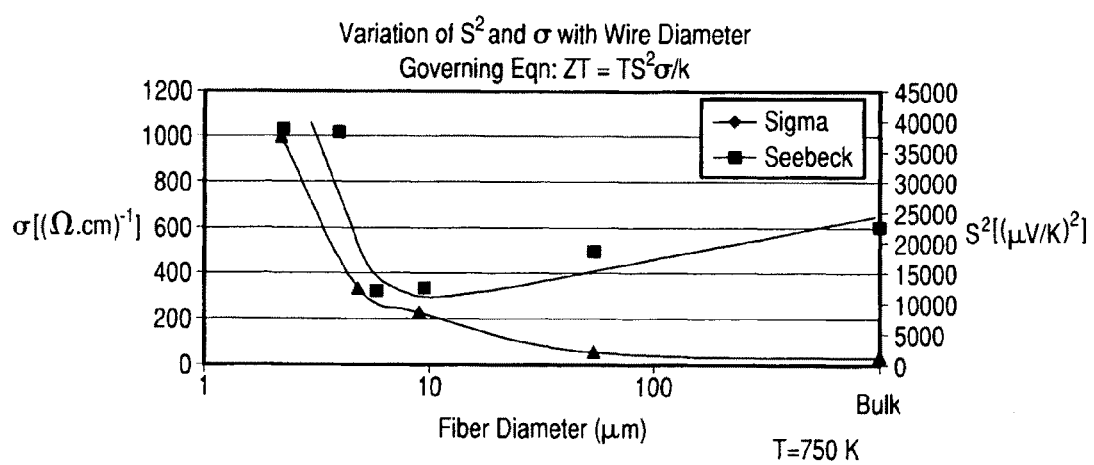
FIG. 11 is a plot of conductivity and Seebeck Coefficient versus wire diameter, illustrating the size effect upon the Seebeck Coefficient and conductivity of the wires in one embodiment.

The dependences of electrical and thermal properties upon the diameter of wire are illustrated in FIGS. 10-14. As illustrated in FIG. 10, a smaller wire diameter can give rise to a larger electrical conductivity increase with increasing temperature, for example from about 400K to about 700K. In one embodiment, where the wire diameter is about 2.2 μm, the electrical conductivity σ can increase from about $10^{1.0}$ (ohm-cm)$^{-1}$ below 500 K to greater than about $10^{1.5}$ (ohm-cm)$^{-1}$ at 600 K, to $10^{2.5}$ (ohm-cm)$^{-1}$ about at 700 K. In another embodiment, as shown in FIG. 11, as the diameter of the wire is reduced from bulk to about 2.2 μm, the electrical conductivity increases by about three order of magnitudes, from about 1 (ohm-cm)$^{-1}$ to more than about 1000 (ohm-cm)$^{-1}$, at 750K. Similarly, the Seebeck Coefficient rises by over about 60% with decreasing diameter size of the wire in the small diameter regime. In one embodiment, while the electrical conductivity increases with decreasing wire diameter (for example, smaller than 10 microns, such as about 1 to about 10 microns), the thermal conductivity of the wire remains relatively constant. The thermopower of the wires can also remain fairly unchanged with decreasing wire diameter. It is believed that decreasing the diameter of a wire may give rise to higher quality of the material resulting in reduction in microstructure defects and/or single crystal or quasi-single crystal semiconductor material across the entire diameter and/or length of the wire, which leads to an increase in electrical conductivity. Additionally, in the embodiments described above, the thermal conductivity and/or thermopower can remain relatively unaffected by the decrease in wire diameter, and the values of which can be comparable to those of a bulk material.

Figures 12A, 12B:
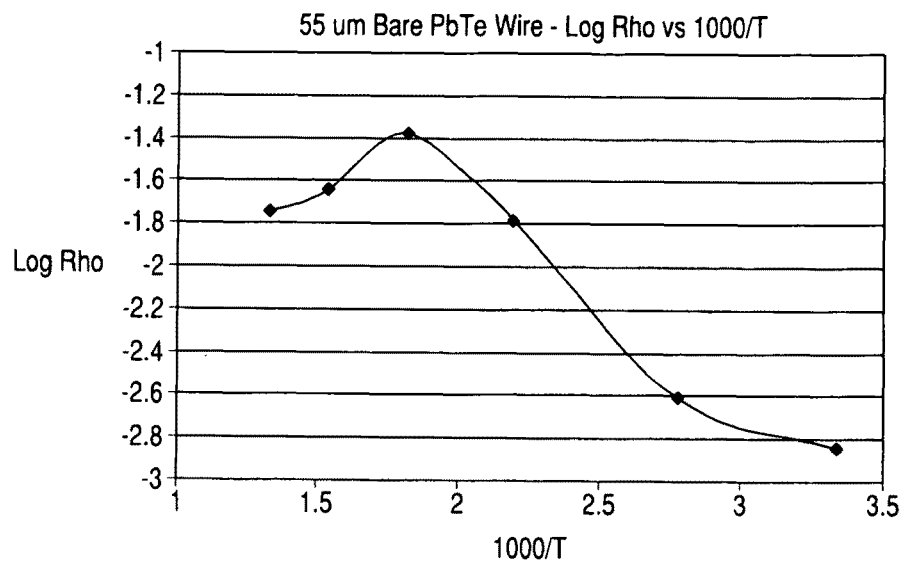
FIGS. 12A and 12B are a plot and a chart, respectively, which provide electrical resistivity as a function of temperature for a bare 55 micron diameter wire in one embodiment.
Figures 13A, 13B:
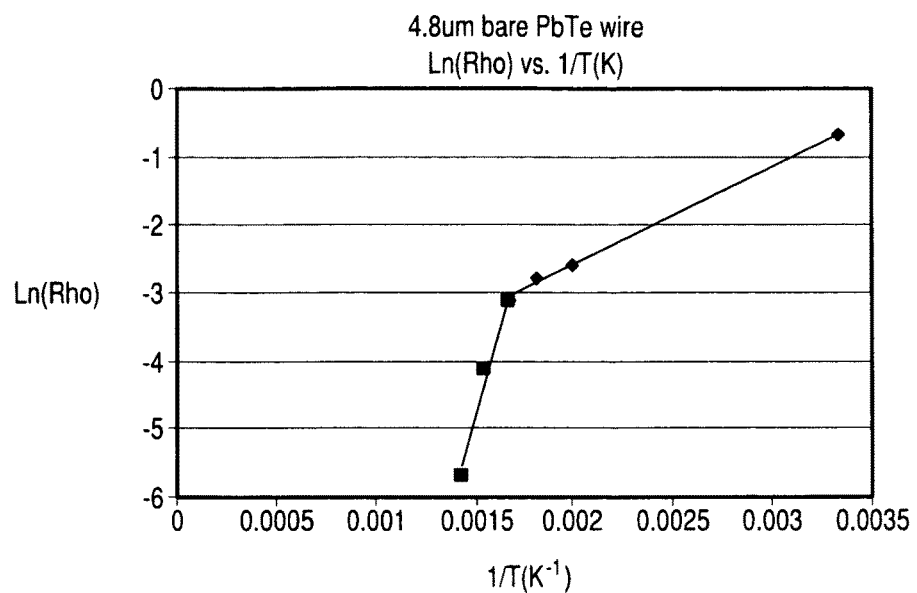
FIGS. 13A and 13B are a plot and a chart, respectively, which provide electrical resistivity as a function of temperature for a bare 4.8 micron diameter wire in one embodiment.
Figures 14A, 14B:
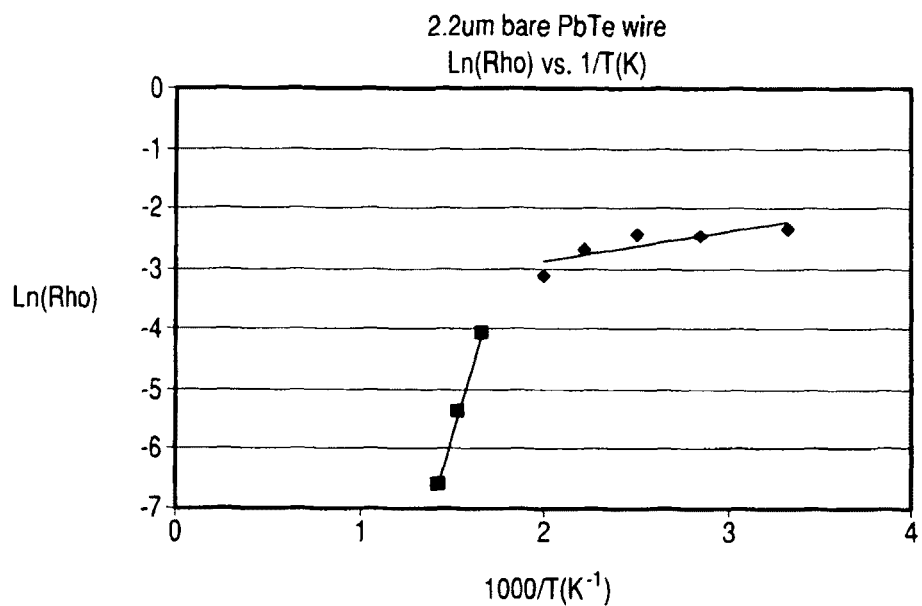
FIGS. 14A and 14B are a plot and a chart, respectively, which provide electrical resistivity as a function of temperature for a bare 2.25 micron diameter wire in one embodiment.

The temperature dependences of a wire of various diameters are provided in FIGS. 12 to 14. As seen in FIGS. 12A and 12B, in one embodiment wherein the diameter of a PbTe wire is about 55 μm, the average electrical resistivity increases from 0.001 ohm-cm to 0.002 ohm-cm, to 0.016 ohm-cm, to 0.042 ohm-cm, as the temperature is increased from 300 K to 360 K, to 456K, and to 551 K, respectively. Note above 551 K, the electrical resistivity begins to decrease. By contrast, as shown in FIGS. 13A and 13B, a different trend showing a monotonic decrease is observed in another embodiment, where the wire diameter is 4.8 μm. The average electrical resistivity of the 4.8 μm diameter bare PbTe wire decreases from 0.51 ohm-cm to 0.075 ohm-cm, to 0.061 ohm-cm, to 0.0033 ohm-cm, as the temperature increases from 300 K, to 500 K, to 550K, to 700 K, respectively. A similar monotonic decrease is observed in another embodiment shown in FIGS. 14A and 14B, wherein the bare PbTe wire diameter is 2.25 µm. In addition to the monotonic decrease in electrical resistivity, the smaller diameter wire has a smaller electrical resistivity in general than its larger wire counterpart, with 0.096 ohm-cm decreasing to 0.0693 ohm-cm, to 0.0442 ohm-cm, to 0.0215 ohm-cm, to 0.00139 ohm-cm from 300 K down to 450 K, to 500 K, to 550 K, down to 700K. In one embodiment, at 750K, a bare PbTe wire with a diameter of 2.25 µm is calculated to have a ZT factor of about 2.4 based on Seebeck Coefficient data for 2 micron wire at 750 K. Thus, the wire of the embodiments of the invention has an electrical conductivity of greater than about $10^{1.5}$ (ohm-cm)$^{-1}$ at a temperature greater or equal to about 600K, and an electrical conductivity of between about 200 (ohm-cm)$^{-1}$ and about 1100 (ohm-cm)$^{-1}$ at about 750 K. Furthermore, the wire has an electrical resistivity of less than about 0.55 ohm-cm at about 300K and an electrical resistivity of less than about 0.0035 ohm-cm at about 700K. When the wire has a diameter of 2.5 µm or less, it has an electrical resistivity of less than about 0.1 ohm-cm at about 300K and an electrical resistivity of less than about 0.0045 ohm-cm at about 700K. In one embodiment, the wire has a diameter of about 2.2 µm and an electrical resistivity of about 0.002 ohm-cm at about 725K.

The wires and/or cable as described above can be part of a thermoelectric device. For example, in one embodiment, a composite fiber for use in a thermoelectric device is provided. The composite fiber can comprise a glass matrix material, such as an electrically insulating glass material, and a plurality of fibers or wires which are encapsulated by the insulating glass matrix material. Each, or at least some, of the plurality of fibers comprises a thermoelectric material and can have any suitable length, such as 1 mm to 10 feet, such as 5 mm to 10 feet, such as 1 cm to 10 feet, such as 1 inch to 6 feet, such as 3 inches to 2 feet. The composite fiber can have a ZT value of at least about 1.5, such as at least about 2 at about 725K to 750K. The diameters of these fibers can be smaller or equal to about 10 microns, such as less than about 5 microns, such as between about 1 and about 5 microns, for example 1-3 microns. The composite fibers can also have the properties as shown in FIGS. 15A-15D. For example, the fiber electrical resistivity can range from about 0.9 mΩ-cm to about 2.5 mΩ-cm, with an average resistivity of about 1.9 mΩ-cm at about 725K (FIG. 15A). Its thermal conductivity can range from about 0.94 W/mK to about 1.1 W/mK, with an average thermal conductivity of about 1 W/mK at about 725K (FIG. 15B). Its thermopower can range from about 230 µV/K to about 430 µV/K, with an average thermopower of about 274 µV/K at about 725K (FIG. 15C). Its ZT values can range from about 1.9 to about 2.4, with an average ZT factor value of about 2.2 at about 725K.

The foregoing description of the embodiments of the invention has been presented for purposes of illustration and description. It is not intended to be exhaustive or to limit the invention to the precise form disclosed, and modifications and variations are possible in light of the above teaching or may be acquired from practice of the invention. The embodiments were chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed:

1. A method of drawing glass clad wires, comprising:
    sealing off one end of a glass tube such that the glass tube has an open end and a closed end;
    introducing a semiconductor material inside the glass tube, wherein the semiconductor material comprises lead telluride, bismuth telluride, silicon germanium, zinc antimonide or zinc cadmium antimonide;
    evacuating the glass tube;
    heating a portion of the glass tube such that the glass partially melts forming a sealed glass tube;
    further heating the glass tube above the semiconductor material melting temperature such that the semiconductor material melts and the glass tube is heated enough for it to be drawn;
    drawing a first glass clad continuous semiconductor wire having a diameter of smaller than about 5 µm;
    providing a plurality of additional glass clad continuous semiconductor wires having diameter of smaller than about 5 µm;
    bunching the first glass clad continuous semiconductor wire and a plurality of a additional glass clad continuous semiconductor wires together to provide a plurality of bunched glass clad continuous semiconductor wires having a diameter of smaller than about 5 µm;
    drawing the bunched glass clad continuous semiconductor wires one or more times to produce a multi core cable having a plurality of continuous semiconductor wires that are insulated from each other by glass cladding; and
    forming at least a portion of the cable into a portion of a thermoelectric device,
    wherein the plurality of bunched glass clad wires comprises the plurality of glass clad continuous thermoelectric semiconductor material wires comprising lead telluride, bismuth telluride, silicon germanium, zinc antimonide or zinc cadmium antimonide.

2. The method of claim 1, wherein the step of introducing the semiconductor material comprises introducing a granular semiconductor material into the glass tube.

3. The method of claim 1, wherein:
    (i) the semiconductor wires consist essentially of PbTe; and
    (ii) a ZT factor of the cable is at least 1.5 at about 750 K.

4. The method of claim 1, wherein at least one of the semiconductor wires comprises a single crystal at least one of (i) along the length of the wire or (ii) across the diameter of the wire.

5. The method of claim 1, wherein at least one of the semiconductor wires comprises a polycrystalline microstructure.

6. The method of claim 5, wherein the polycrystalline microstructure comprises at least some grains with a preferred crystallographic orientation.

7. The method of claim 1, further comprising fabricating a thermoelectric generator or a thermoelectric refrigerator with the plurality of glass clad continuous thermoelectric semiconductor material wires.

8. The method of claim 3, wherein the step of further heating the glass tube above the semiconductor material melting temperature comprises heating the glass tube above 920 C to about 1030 C.

9. The method of claim 8, wherein:
    a ZT factor of the cable ranges from about 1.9 to about 2.4 at 725 K;
    an electrical resistivity of the bunched glass clad continuous semiconductor wires ranges from about 0.9 mΩ-cm to about 2.5 mΩ-cm at 725K;

a thermal conductivity of the bunched glass clad continuous semiconductor wires ranges from about 0.94 W/mK to about 1.1 W/mK at 725K; and a thermopower of the bunched glass clad continuous semiconductor wires ranges from about 230 µV/K to about 430 µV/K at 725K.

\* \* \* \* \*